United States Patent
Baroky et al.

(10) Patent No.: US 7,708,427 B2
(45) Date of Patent: May 4, 2010

(54) LIGHT SOURCE DEVICE AND METHOD OF MAKING THE DEVICE

(75) Inventors: Tajul Arosh Baroky, Penang (MY); Janet Bee Yin Chua, Perak (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 146 days.

(21) Appl. No.: 11/454,567

(22) Filed: Jun. 16, 2006

(65) Prior Publication Data

US 2007/0291489 A1    Dec. 20, 2007

(51) Int. Cl.
*F21V 33/00* (2006.01)
(52) U.S. Cl. .......................................... 362/238; 257/98
(58) Field of Classification Search .................. 362/227, 362/238, 241, 242, 294, 555, 559, 560, 800; 361/681, 717–723, 760, 806; 174/252, 260, 174/261, 262; 257/E25.2, E33.067, E33.072, 257/E33.073, E33.075, 98, 99
See application file for complete search history.

(56) References Cited

U.S. PATENT DOCUMENTS

| | | | | |
|---|---|---|---|---|
| 4,729,061 A * | 3/1988 | Brown | ......................... | 361/719 |
| 4,742,432 A * | 5/1988 | Thillays et al. | ............. | 361/783 |
| 5,119,174 A * | 6/1992 | Chen | ........................... | 257/98 |
| 5,467,252 A * | 11/1995 | Nomi et al. | ................. | 361/760 |
| 6,428,189 B1 * | 8/2002 | Hochstein | .................... | 362/373 |
| 6,730,533 B2 * | 5/2004 | Durocher et al. | .............. | 438/26 |
| 6,921,183 B2 * | 7/2005 | Yang et al. | ................... | 362/241 |
| 6,999,318 B2 * | 2/2006 | Newby | ........................ | 361/719 |
| 7,008,079 B2 | 3/2006 | Smith | | |
| 7,095,053 B2 * | 8/2006 | Mazzochette et al. | ......... | 257/81 |
| 7,196,459 B2 * | 3/2007 | Morris | ........................ | 313/46 |
| 7,218,041 B2 * | 5/2007 | Isoda | ........................... | 313/11 |
| 7,285,802 B2 * | 10/2007 | Ouderkirk et al. | ............. | 257/98 |
| 7,329,942 B2 * | 2/2008 | Tsou et al. | ................... | 257/594 |
| 7,436,000 B2 * | 10/2008 | Kim et al. | ...................... | 257/98 |
| 2007/0018558 A1 * | 1/2007 | Chua et al. | .................. | 313/485 |

* cited by examiner

Primary Examiner—Hargobind S Sawhney (57) ABSTRACT

A light source device and method of making the device uses a substrate, which may be a glass or ceramic substrate, having thru-holes for heat dissipation. The light source device includes a number of light-emitting dies that are mounted on the substrate such that each thru-hole is positioned directly below one of the light-emitting dies.

9 Claims, 6 Drawing Sheets

LIGHT SOURCE DEVICE AND METHOD OF MAKING THE DEVICE

BACKGROUND OF THE INVENTION

Light emitting diodes ("LEDs") have many advantages over conventional light sources, such as incandescent, halogen and fluorescent lamps. These advantages include longer operating life, lower power consumption and smaller size. Consequently, conventional light sources are increasingly being replaced with LEDs in traditional lighting applications. As an example, LEDs are currently being used in flashlights, traffic signal lights, automotive exterior and interior lights and display devices.

A typical LED includes an LED die mounted on a substrate, such as a leadframe, and encapsulated in a molded lamp package. Since the light output of an LED is limited, the LED die may be mounted in a reflector cup formed on the substrate to collect the light emitted by the LED die and direct the light upward toward the top of the transparent lamp package. Moreover, the transparent lamp package of the LED may have a domed top, which functions as a lens to focus the light emitted from the LED die.

Different LED-based light source devices have been developed for various lighting applications. A typical LED-based light source device includes a number of LEDs to produce the desired illumination. These LEDs are usually mounted on a printed circuit board (PCB). An important design consideration of an LED-based light source device is heat management. When activated to generate light, an LED die produces a significant amount of heat, which is compounded when there are multiple LED dies in a small area. Unless properly dissipated, the collective heat generated by the LED dies can degrade the performance of the LED dies and even damage the light source device. Thus, the heat dissipation efficiency of the LED-based light source device may limit the density of LED dies that can be included in the device and/or limit the amount of current used to drive the LED dies.

In view of these concerns, there is a need for an LED-based light source device with increased heat dissipation efficiency so that the device can have a higher density of LED dies and/or the LED dies can be driven with higher current.

SUMMARY OF THE INVENTION

A light source device and method of making the device uses a substrate, which may be a glass or ceramic substrate, having thru-holes for heat dissipation. The light source device includes a number of light-emitting dies that are mounted on the substrate such that each thru-hole is positioned directly below one of the light-emitting dies. The design of the light source device provides efficient dissipation of heat generated from the light-emitting dies, which allows for higher density of light-emitting dies and/or use of higher driving currents.

A light source device in accordance with an embodiment of the invention comprises a substrate having thru-holes with thermally conductive material therein, a plurality of electrical traces on at least one of top and bottom major surfaces of the substrate, and a plurality of light-emitting dies mounted on the top major surface of the substrate and electrically connected to some of the electrical traces. Each of the light-emitting dies is positioned directly over one of the thru-holes of the substrate. The thru-holes are used to dissipate heat generated from the light-emitting dies.

A light source devices in accordance with another embodiment of the invention comprises a substrate comprised of one of glass and ceramic materials, a plurality of electrical traces on at least one of top and bottom major surfaces of said substrate, and a plurality of light-emitting dies mounted on the top major surface of the substrate and electrically connected to some of the electrical traces.

A method of making a light source device in accordance with an embodiment of the invention comprises providing a substrate having thru-holes with thermally conductive material therein, forming a plurality of electrical traces on at least one of top and bottom major surfaces of the substrate, and mounting a plurality of light-emitting dies on the top major surface of said substrate such that each of the light-emitting dies is directly over one of the thru-holes of the substrate.

Other aspects and advantages of the present invention will become apparent from the following detailed description, taken in conjunction with the accompanying drawings, illustrated by way of example of the principles of the invention.

DETAILED DESCRIPTION

Figure 1:
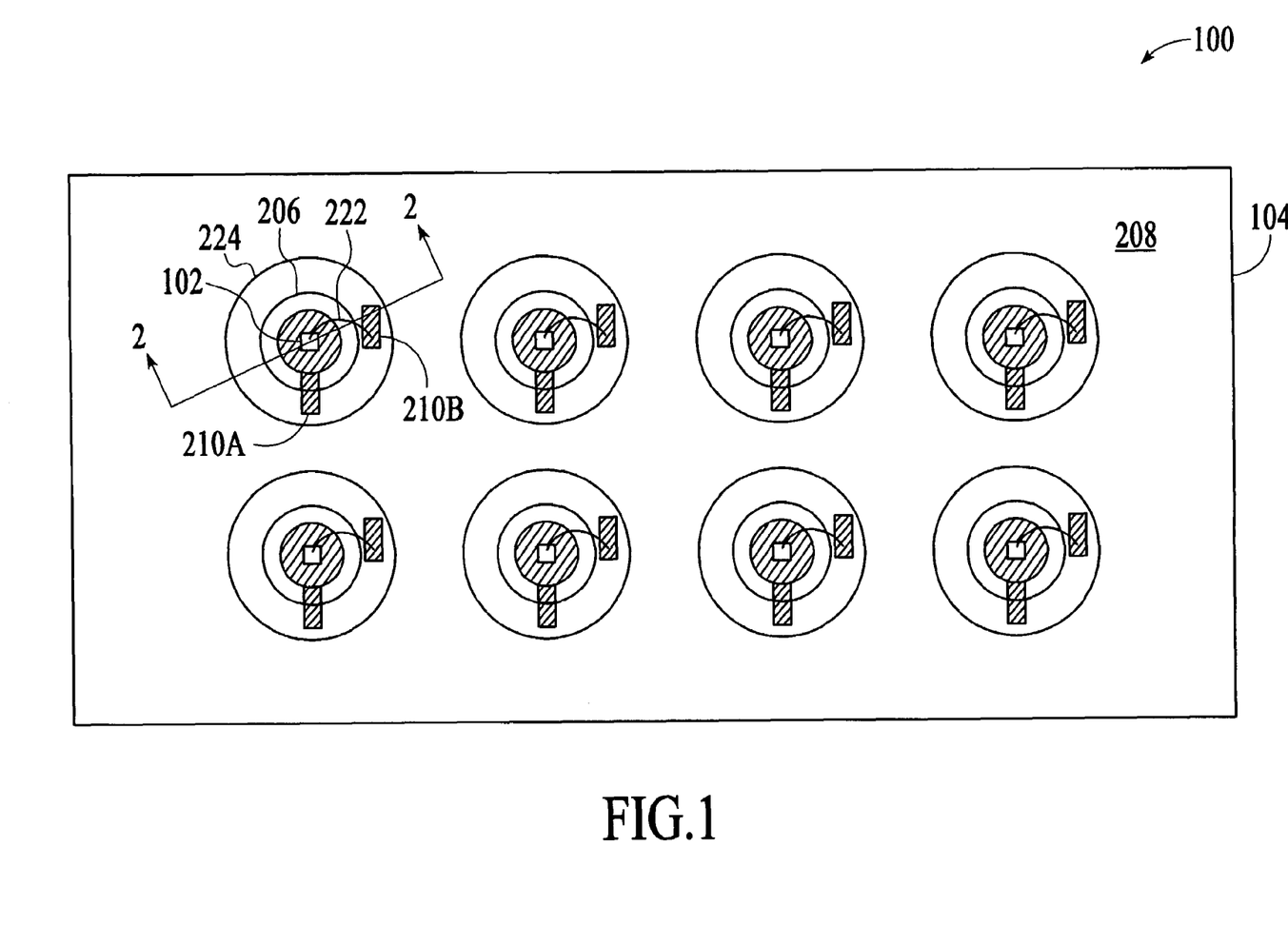
FIG. 1 is a top view of a light source device in accordance with an embodiment of the invention.

With reference to FIG. 1, a light source device 100 in accordance with an embodiment of the invention is described. The light source device 100 includes a number of light-emitting dies 102, which may be light-emitting diode (LED) dies or laser diodes, to produce a desired illumination. The light source device 100 is designed to efficiently dissipate heat generated by the light-emitting dies 102. Thus, the light source device 100 can have a higher density of light-emitting dies and/or the light-emitting dies can be driven with higher current than conventional light source devices.

Figure 2:
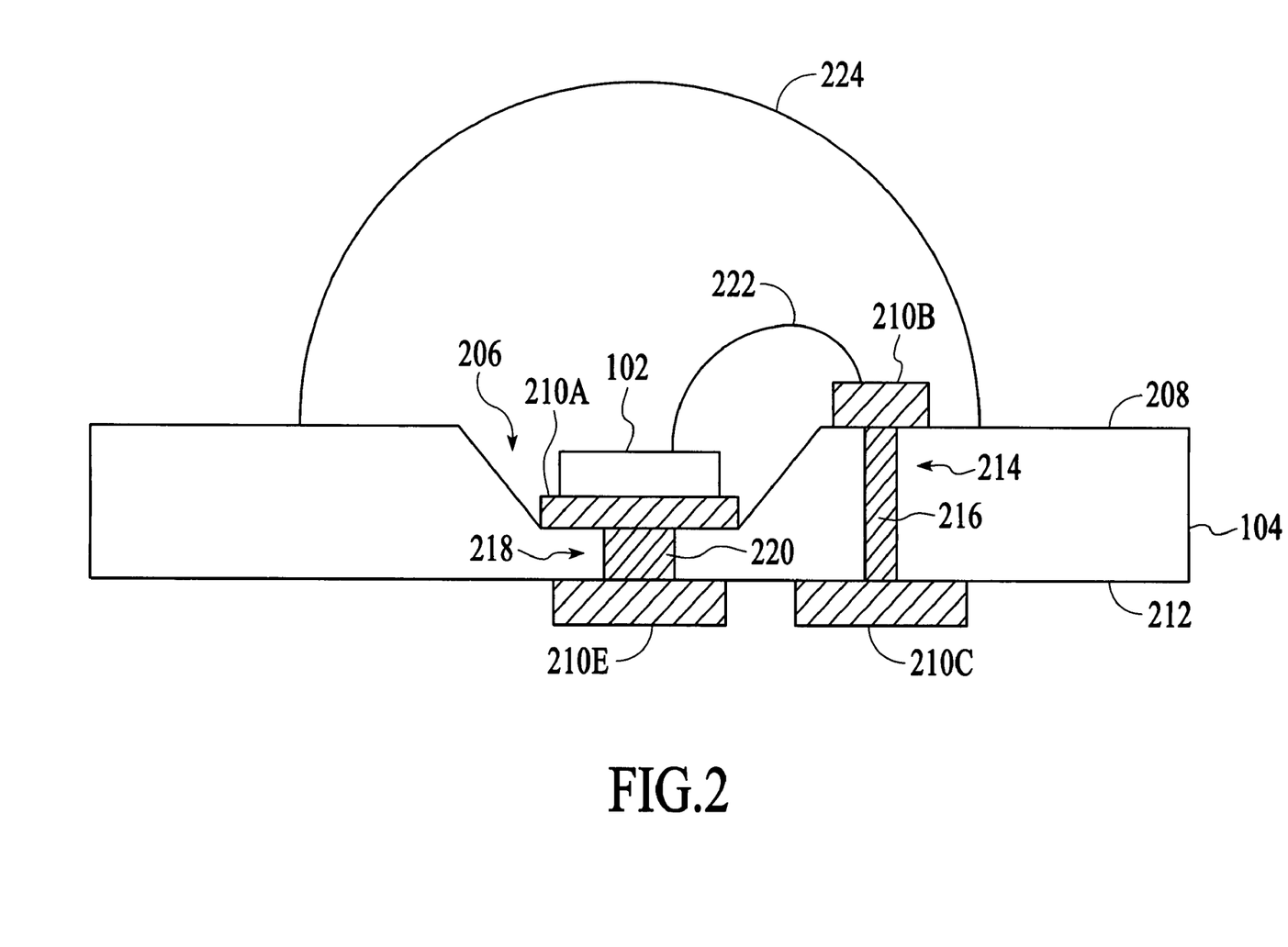
FIG. 2 is a cross-sectional view of the light source device of FIG. 1 along the line 2-2.

As shown in FIG. 1, the light source device 100 includes a substrate 104 on which the light-emitting dies 102 are mounted. In this embodiment, the substrate 104 is a glass or ceramic substrate. However, in other embodiments, the substrate 104 can be made of other material, such as plastic, polymer or liquid crystal polymer (LCP) material. As shown in FIG. 2, which is a partial cross-sectional view of the light source device 100 along the line 2-2 in FIG. 1, the substrate 104 includes depressions 206 or reflector cups on the top major surface 208 of the substrate 104. The reflector cups 206 may have a polished reflective surface or a reflective metallic coating, such as a reflective silver, palladium or gold coating. In the embodiment illustrated in FIG. 1, the reflector cups 206 are arranged on the top major surface 208 of the substrate 104 in two rows and four columns. However, in other embodiments, the reflector cups 206 may be arranged on the top major surface 208 of the substrate 104 in any number of rows and columns or in any configuration. As described in more detail below, the light-emitting dies 102 are mounted in the reflector cups 206 of the substrate 104.

Figure 3A:
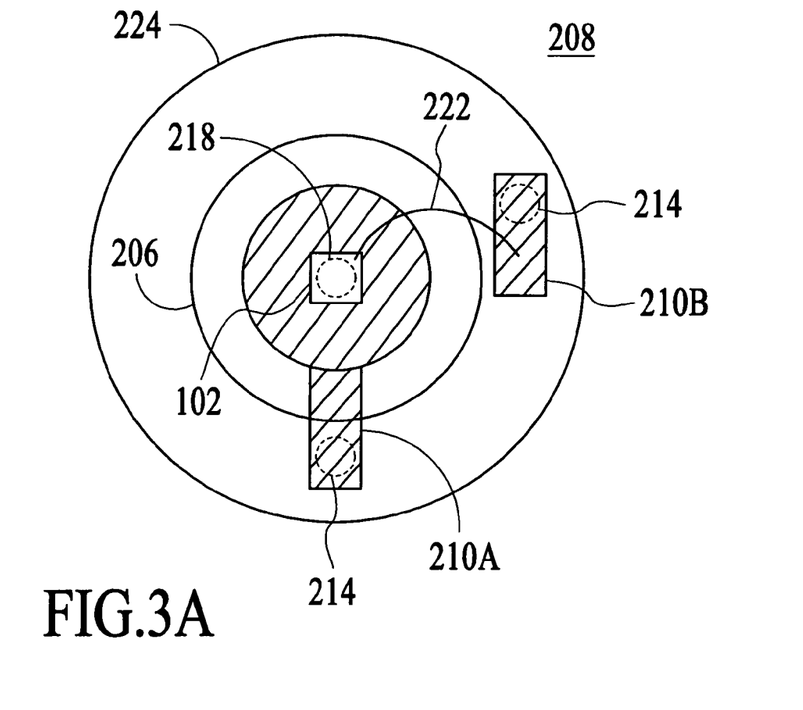
FIG. 3A is a partial view of the top major surface of substrate, which is part of the light source device of FIG. 1.

The substrate 104 includes electrical traces 210 on the top major surface 208 and the bottom major surface 212 of the substrate 104. The electrical traces 210 on the top major surface 208 of the substrate 104 will sometimes be referred to herein as the overlying electrical traces, while the electrical traces on the bottom major surface 212 of the substrate will sometimes be referred to herein as the underlying electrical traces. These electrical traces 210 can be made of any electrically conductive material, such as copper or indium tin oxide (ITO), which may be printed, plated or etched on the top major surface 208 and the bottom major surface 212 of the substrate 104. As shown in FIG. 3A, which is a more detailed partial view of the top major surface 208 of the substrate 104, the overlying electrical traces 210 on the top major surface of the substrate include overlying electrical traces 210A and 210B. Each of the overlying electrical traces 210A extends into the corresponding reflector cup 206 of the substrate 104 onto the bottom surface of that reflector cup. These overlying electrical traces 210A serve as cathode connections to the light-emitting dies 102 to conduct driving currents through the light-emitting dies, which activate the light-emitting dies to generate light. Each of the overlying electrical traces 210B extends near the corresponding reflector cup 206 of the substrate 104. These overlying electrical traces 210B serve as anode connections to the light-emitting dies 102 to supply driving currents to the light-emitting dies.

As shown in FIG. 2, the substrate 104 has vias 214 that are filled with electrically conductive material 216. The vias 214 extend completely through the substrate 104 so that the conductive material 216 in the vias can be accessed from both the top major surface 208 and the bottom major surface 212 of the substrate. The overlying electrical traces 210A and 210B on the top major surface 208 of the substrate 104 extend to the vias 222. The conductive material 216 in the vias 216 is used to electrically connect the overlying electrical traces 210A and 210B on the top major surface 208 of the substrate 104 and the underlying electrical traces 210 on the bottom major surface 212 of the substrate. The substrate 104 also has thru-holes 218 that are filled with thermally conductive material 220. Each thru-hole 218 is formed in one of the reflector cups 206 and is positioned directly below the light-emitting die 102 mounted in that reflector cup.

The light-emitting dies 102 are mounted in the reflector cups 206 of the substrate 104 on the electrical traces 210A using appropriate adhesive material, which is electrically and thermally conductive. Thus, the light-emitting dies 102 are electrically connected to the overlying cathode electrical traces 210A. The light-emitting dies 102 are also electrically connected to the overlying anode electrical traces 210B via bondwires 222. Since the light-emitting dies 102 are mounted in the reflector cups 206 of the substrate 104, which are distributed throughout the top major surface 208 of the substrate, the light-emitting dies are similarly distributed on the top major surface of the substrate. The light-emitting dies 102 of the light source device 100 may include only light-emitting dies configured to generate light of a particular color. Alternatively, the light-emitting dies 102 may include different light-emitting dies configured to generate light of different colors, such as red, green, blue and white.

Each light-emitting die 102 is encapsulated in a transparent dome 224 formed over the light-emitting dies using a transparent material, which can be epoxy, silicone, a hybrid of silicone and epoxy, amorphous polyamide resin or fluorocarbon, glass and/or plastic material. In an embodiment, the transparent encapsulation dome 224 over each light-emitting die 102 encapsulates not only the light-emitting die but also the reflector cup 206 in which the light-emitting die is mounted and the overlying electrical traces 210A and 210B connected to the light-emitting die. The encapsulation dome 224 provides a protective barrier for the encapsulated components of the light source device 100. The encapsulation dome 224 may also function as a lens to optically manipulate the light emitted from the encapsulated light-emitting die 102. In an alternative embodiment, each light-emitting die 102 may be covered by a transparent conformal coating (not shown). The transparent conformal coating may also cover the overlying electrical traces 210A and 210B connected to the light-emitting die 102.

Figure 3B:
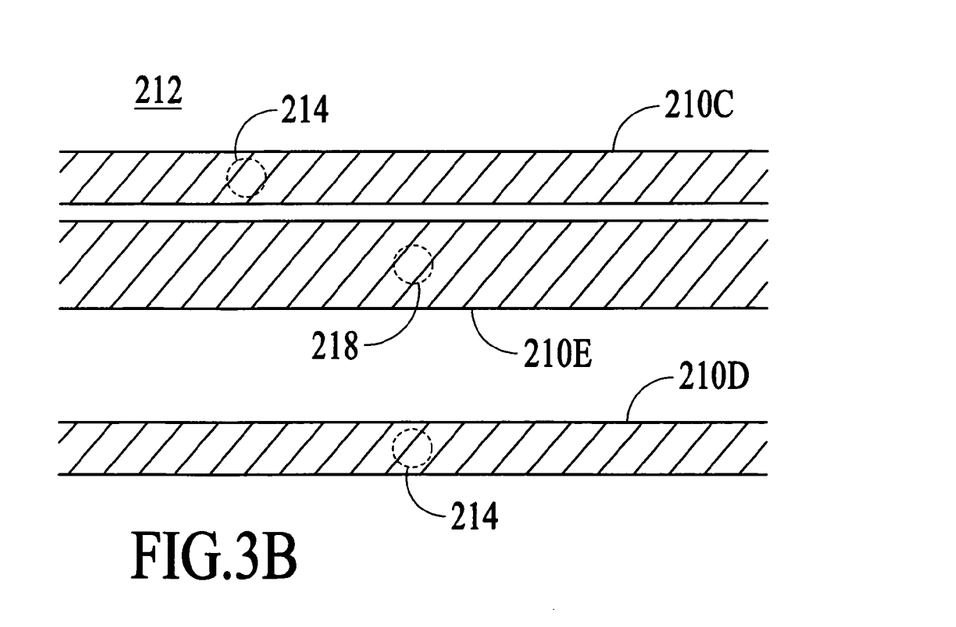
FIG. 3B is a partial view of the bottom major surface of the substrate

The underlying electrical traces 210 on the bottom major surface 212 of the substrate 104 extend throughout the bottom major surface and are selectively connected to the electrically conductive material 216 in the vias 214 and the thermally conductive material 220 in the thru-holes 218. As illustrated in FIG. 3B, the underlying electrical traces 210 include "active" electrical traces 210C and 210D. The underlying electrical traces 210C are electrically connected to the overlying cathode electrical traces 210A through the electrically conductive material 216 in the vias 214 that are connected to the overlying cathode electrical traces. The underlying electrical traces 210D are electrically connected to the overlying anode electrical traces 210B through the electrically conductive material 216 in the vias 214 that are connected to the overlying anode electrical traces. These underlying electrical traces 210C and 210D may be arranged to form series or parallel circuits to drive the light-emitting dies 102 mounted in the reflector 206 cups of the substrate 104. The underlying electrical traces 210 also include "dummy" traces 210E that are connected to the thermally conductive material 220 in the thru-holes 218 to dissipate the heat generated from the light-emitting dies 102. The "dummy" traces 210E are not connected to conduct electrical current (only connected to the overlying cathode electrical traces 210A), but rather to conduct heat from the light-emitting dies 102. The active underlying electrical traces 210C and 210D are routed to appropriate pads (not shown) on the bottom major surface 212 of the substrate 104. In some embodiments, the substrate 104 may include thermally conductive additives, such as Boron Nitride or metal particles, to increase the thermal conductivity of the substrate to dissipate the heat generated from the light-emitting dies 102. In these embodiments, the thermally conductive additives must be electrically insulated from the electrical traces 210 and other electrical connections on the substrate 104.

Figure 4:
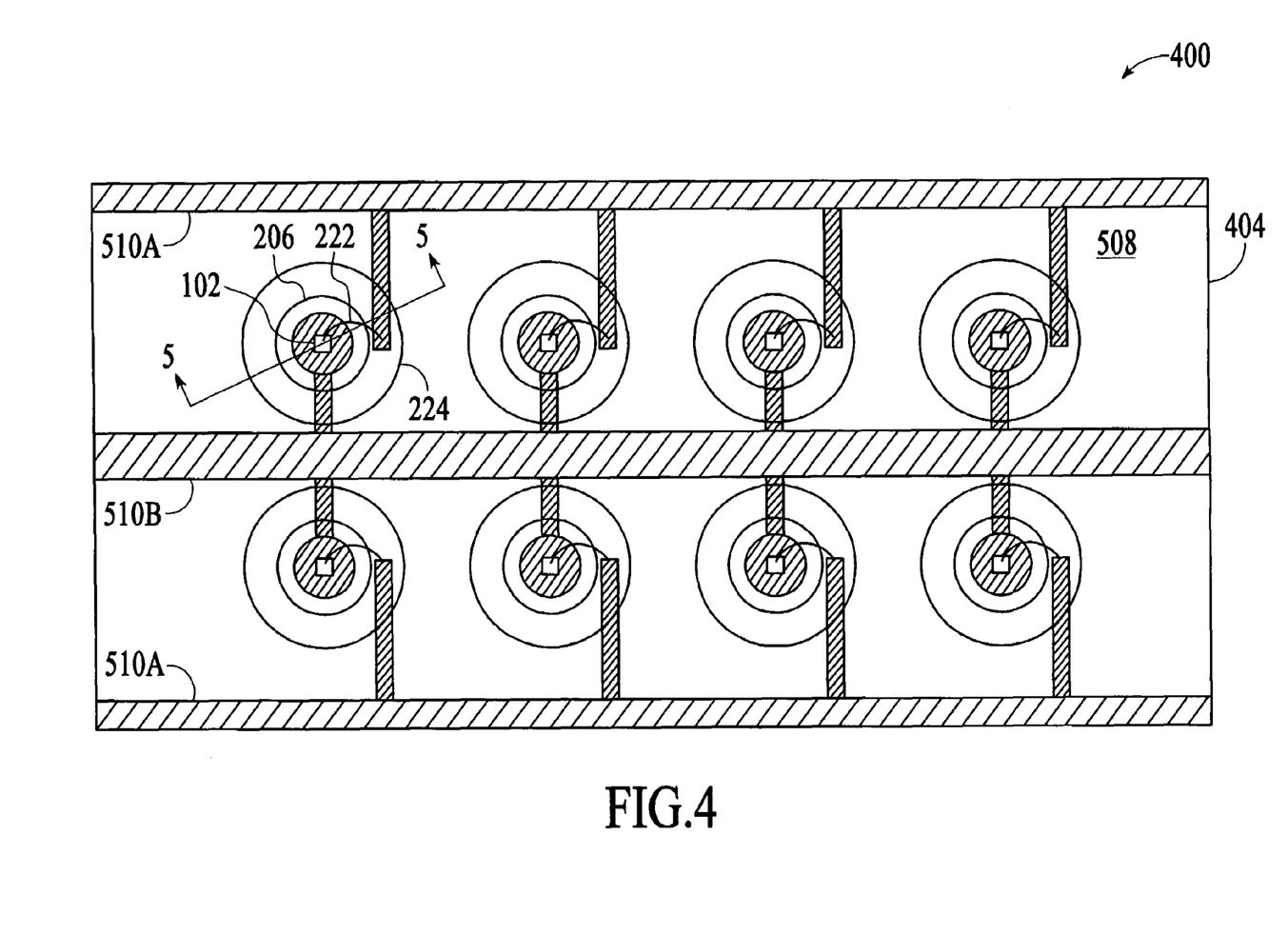
FIG. 4 is a top view of a light source device in accordance with an alternative embodiment of the invention.
Figure 5:
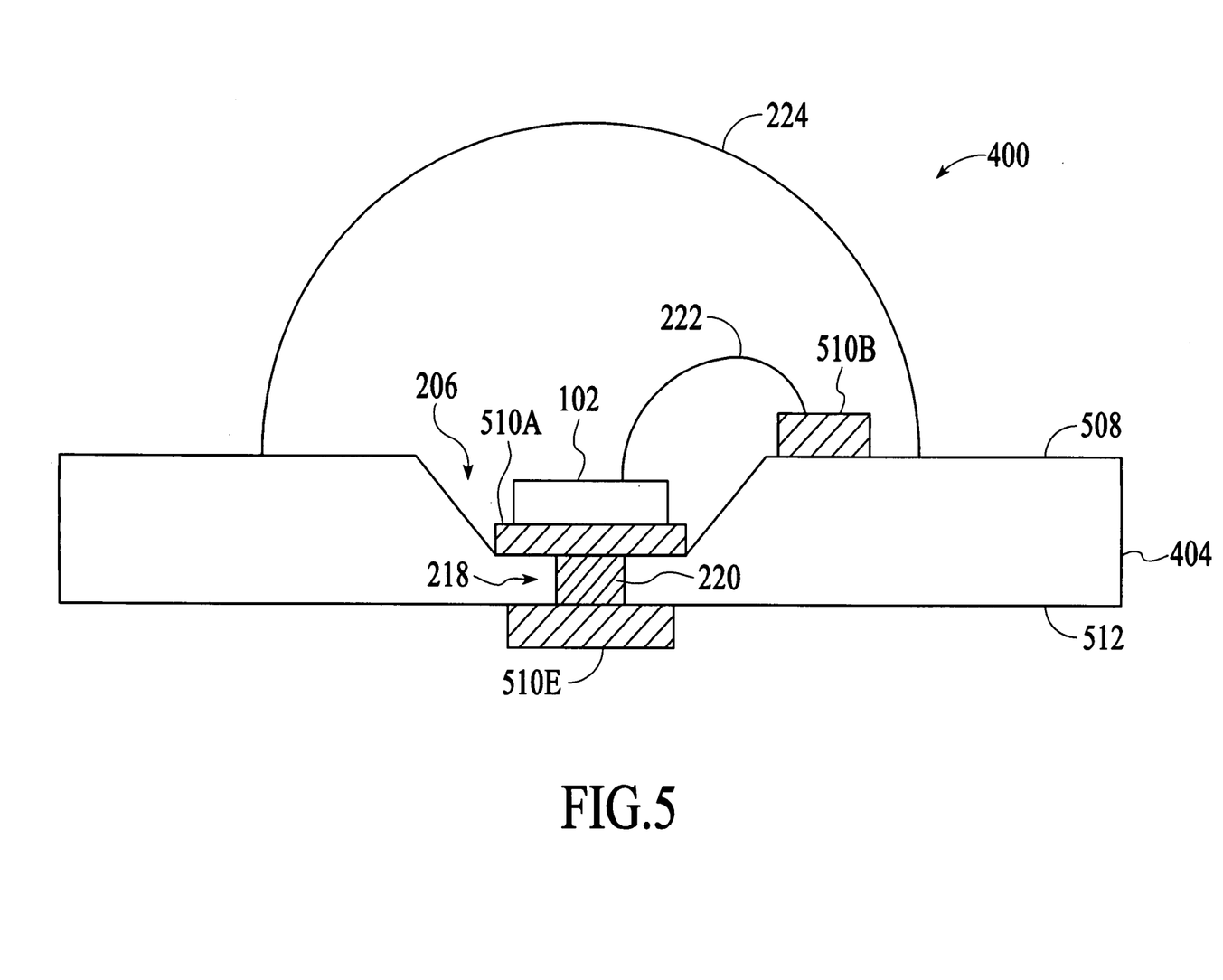
FIG. 5 is a cross-sectional view of the light source device of FIG. 4 along the line 5-5.

Turning now to FIG. 4, a light source device 400 in accordance with an alternative embodiment of the invention is shown. The same reference numbers used in FIGS. 1 and 2 will be used to identify similar elements in FIG. 4. Similar to the light source device 100, the light source device 400 includes a substrate 404 on which on which the light-emitting dies 102 are mounted. However, in this alternative embodiment, active electrical traces 510A and 510B are exclusively on the top major surface 508 of the substrate, as illustrated in FIG. 5, which is a partial cross-sectional view of the light source device 400 along line 5-5 in FIG. 4. That is, there are no active electrical traces on the bottom major surface 512 of the substrate 404. There is/are only "dummy" electrical trace(s) 510E on the bottom major surface 512 of the substrate 404.

As shown in FIG. 5, the substrate 404 includes depressions 206 or reflector cups on the top major surface 508 of the substrate. The reflector cups 206 may have a polished reflective surface or a reflective metallic coating, such as a reflective silver or gold coating. In this embodiment, the substrate 404 is a glass or ceramic substrate. However, in other embodiments, the substrate 404 can be made of other material, such as plastic, polymer or liquid crystal polymer (LCP) material.

Turning back to FIG. 4, the electrical trace 510B on the top major surface 508 of the substrate 404 is used as a central anode bus to supply driving current to the light-emitting dies 102. The other electrical traces 510A on the top major surface 508 of the substrate 404 are used cathode electrical traces. These electrical traces 510A and 510B can be made of any electrically conductive material, such as copper or indium tin oxide (ITO), which may be printed, plated or etched on the top and bottom major surfaces 508 and 512 of the substrate 404. Since there are no active electrical traces on the bottom major surface 512 of the substrate 404 of the light source device 400, the substrate does not include vias, which were used in the substrate 104 of the light source device 100 to electrically connect the overlying electrical traces 210A and 210B and the active underlying electrical traces 210C and 210D. However, the substrate 404 has thru-holes 218 that are filled with thermally conductive material 220. Each thru-hole 218 is formed in one of the reflector cups 206 and is positioned directly below the light-emitting die 102 mounted in that reflector cup.

The light-emitting dies 102 are mounted in the reflector cups 206 of the substrate 404 on the electrical traces 510A using appropriate adhesive material, which is electrically and thermally conductive. Thus, each of the light-emitting dies 102 is electrically connected to one of the cathode electrical traces 510A. Each light-emitting die 102 is also electrically connected to the anode electrical bus 510B via bondwires 222. Each light-emitting die 102 is encapsulated in a transparent dome 224 formed over the light-emitting die using a transparent material, which can be epoxy, silicone, a hybrid of silicone and epoxy, amorphous polyamide resin or fluorocarbon, glass and/or plastic material. The encapsulation dome 224 provides a protective barrier for the encapsulated components of the light source device 400. The encapsulation dome 224 may also function as a lens to optically manipulate the light emitted from the encapsulated light-emitting die 102. In an alternative embodiment, each light-emitting die 102 may be covered by a transparent conformal coating or optical gel (not shown).

Figure 6:
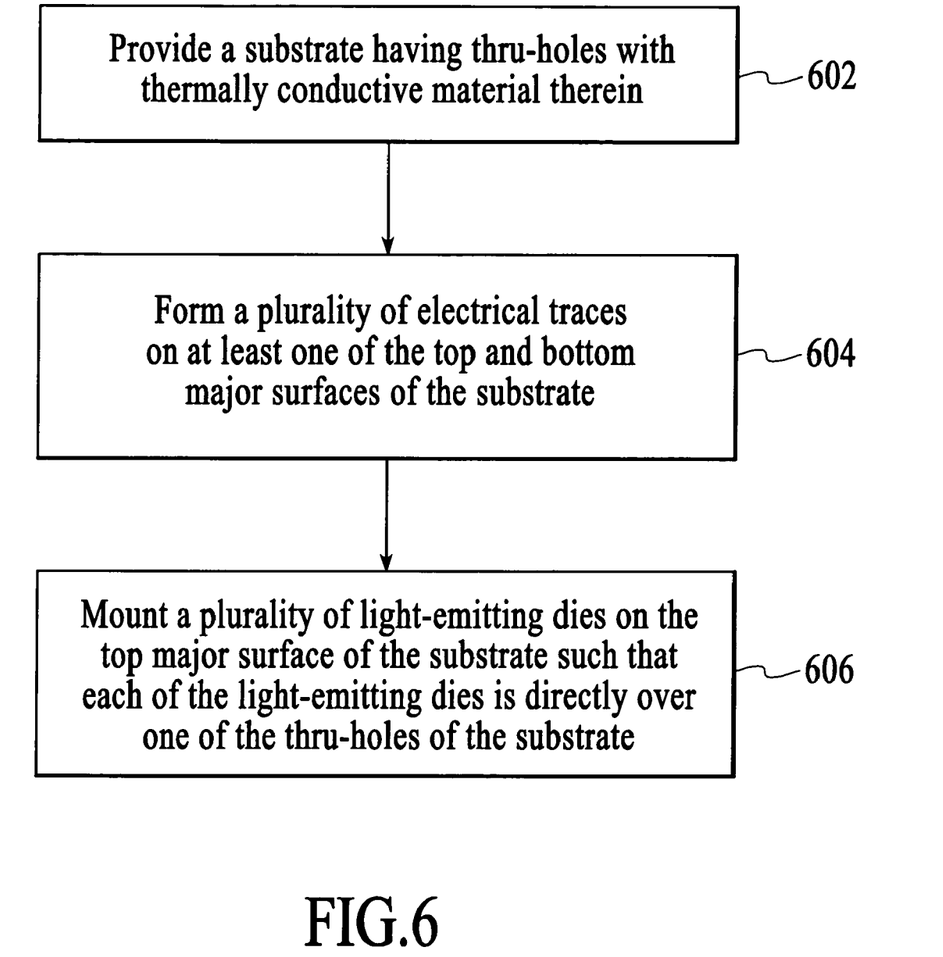
FIG. 6 is a flow diagram of a method of making a light source device in accordance with an embodiment of the invention.

A method of making a light source device in accordance with an embodiment of the invention is described with reference to FIG. 6. At block 602, a substrate having thru-holes with thermally conductive material therein is provided. At block 604, a plurality of electrical traces is formed on at least one of the top and bottom major surfaces of the substrate. At block 606, a plurality of light-emitting dies is mounted on the top major surface of the substrate such that each of the light-emitting dies is directly over one of the thru-holes of the substrate.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A light source device comprising:
   a substrate having thru-holes with thermally conductive material therein, said substrate including top and bottom major surfaces, said substrate further including depressions in said top major surface that form reflector cups;
   a plurality of active electrical traces on said top major surface of said substrate, said plurality of active electrical traces including a central anode bus and first and second cathode buses, said central anode bus being situated between said first and second cathode buses such that a first group of said reflector cups are positioned between the central anode bus and said first cathode bus and a second group of said reflector cups are positioned between the central anode bus and said second cathode bus, said central anode bus having extensions to the bottom surface of each of said reflector cups of said substrate, said first cathode bus having extensions toward each of said first group of said reflector cups, said second cathode bus having extensions toward each of said second group of said reflector cups;
   a plurality of light-emitting dies mounted in said reflector cups of said substrate on said extensions of said central anode bus, each of said light-emitting dies mounted in said first group of said reflector cups being electrically bondwire connected to said extensions of said first cathode bus, each of said light-emitting dies mounted in said second group of said reflector cups being electrically bondwire connected to said extensions of said second cathode bus, each of said light-emitting dies being positioned directly over one of said thru-holes of the substrate, said thru-holes being used to dissipate heat generated from said light-emitting dies; and
   at least one dummy electrical trace on said bottom major surface of said substrate, said thermally conductive material in each of said thru-holes being connected to said at least one dummy electrical trace.

2. The light source device of claim 1 wherein said substrate is one of a glass substrate and a ceramic substrate.

3. The light source device of claim 1 wherein surfaces of said reflector cups have reflective coatings.

4. The light source device of claim 1 wherein said active electrical traces are made of indium tin oxide (ITO) or copper.

5. The light source device of claim 1 wherein said substrate includes thermally conductive additives.

6. A light source devices comprising:
   a substrate comprised of one of glass and ceramic materials, said substrate including top and bottom major surfaces, said substrate further including depressions in said top major surface that form reflector cups, said substrate further including thru-holes with thermally conductive material therein below said reflector cups;
   a plurality of active electrical traces on said top major surface of said substrate, said plurality of active electrical traces including a central anode bus and first and second cathode buses, said central anode bus being situated between said first and second cathode buses such that a first group of said reflector cups are positioned between the central anode bus and said first cathode bus and a second group of said reflector cups are positioned between the central anode bus and said second cathode bus, said central anode bus having extensions to the bottom surface of each of said reflector cups of said substrate, said first cathode bus having extensions toward each of said first group of said reflector cups, said second cathode bus having extensions toward each of said second group of said reflector cups;
   a plurality of light-emitting dies mounted in said reflector cups of said substrate on said extensions of said central anode bus, each of said light-emitting dies mounted in said first group of said reflector cups being electrically bondwire connected to said extensions of said first cathode bus, each of said light-emitting dies mounted in said second group of said reflector cups being electrically bondwire connected to said extensions of said second cathode bus, each of said light-emitting dies being positioned directly over one of said thru-holes of the substrate, said thru-holes being used to dissipate heat generated from said light-emitting dies; and at least one dummy electrical trace on said bottom major surface of said substrate, said thermally conductive material in each of said thru-holes being connected to said at least one dummy electrical trace.

7. The light source device of claim 6 wherein said active electrical traces are made of indium tin oxide (ITO) or copper.

8. A method of making a light source device, said method comprising:

providing a substrate having thru-holes with thermally conductive material therein, said substrate including top and bottom major surfaces, said substrate further including depressions in said top major surface that form reflector cups;

forming a plurality of active electrical traces on said top major surface of said substrate, said plurality of active electrical traces including a central anode bus and first and second cathode buses, said central anode bus being situated between said first and second cathode buses such that a first group of said reflector cups are positioned between the central anode bus and said first cathode bus and a second group of said reflector cups are positioned between the central anode bus and said second cathode bus, said central anode bus having extensions to the bottom surface of each of said reflector cups of said substrate, said first cathode bus having extensions toward each of said first group of said reflector cups, said second cathode bus having extensions toward each of said second group of said reflector cups;

mounting a plurality of light-emitting dies in said reflector cups of said substrate on said extensions of said central anode bus such that each of said light-emitting dies is directly over one of said thru-holes of said substrate, including electrically bondwire connecting each of said light-emitting dies mounted in said first group of said reflector cups to said extensions of said first cathode bus and electrically bondwire connecting each of said light-emitting dies mounted in said second group of said reflector cups to said extensions of said second cathode bus; and forming at least one dummy electrical trace on said bottom major surface of said substrate such that said thermally conductive material in each of said thru-holes is connected to said at least one dummy electrical trace.

9. The method of claim 8 wherein said providing said substrate includes providing one of a glass substrate and a ceramic substrate.

* * * * *